(12) United States Patent
Cha et al.

(10) Patent No.: US 10,811,474 B2
(45) Date of Patent: Oct. 20, 2020

(54) DISPLAY APPARATUS AND METHOD OF MANUFACTURING THE SAME

(71) Applicant: Samsung Display Co., Ltd., Yongin-Si, Gyeonggi-Do (KR)

(72) Inventors: Gwangmin Cha, Yongin-si (KR); Woongsik Kim, Yongin-si (KR); Jinsu Byun, Yongin-si (KR); Koichi Sugitani, Yongin-si (KR); Saehee Han, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/406,237

(22) Filed: May 8, 2019

(65) Prior Publication Data
US 2020/0066811 A1 Feb. 27, 2020

(30) Foreign Application Priority Data
Aug. 23, 2018 (KR) .................. 10-2018-0098765

(51) Int. Cl.
| | |
|---|---|
| *H01L 27/32* | (2006.01) |
| *H01L 51/52* | (2006.01) |
| *G02B 27/01* | (2006.01) |
| *G02B 27/42* | (2006.01) |

(52) U.S. Cl.
CPC ...... *H01L 27/3244* (2013.01); *G02B 27/0101* (2013.01); *G02B 27/4233* (2013.01); *H01L 51/5237* (2013.01); *H01L 51/5262* (2013.01)

(58) Field of Classification Search
None
See application file for complete search history.

(56) References Cited

U.S. PATENT DOCUMENTS

| | | | |
|---|---|---|---|
| 7,410,906 B2 | 8/2008 | Araki | |
| 10,459,133 B1 * | 10/2019 | Liang | ............... H01S 3/063 |
| 2018/0294317 A1 | 10/2018 | Wolk et al. | |
| 2018/0314067 A1 | 11/2018 | Choi et al. | |

FOREIGN PATENT DOCUMENTS

| | | |
|---|---|---|
| JP | 2006-054417 A | 2/2006 |
| KR | 10-2002-0028014 A | 4/2002 |
| KR | 10-2014-0118414 A | 10/2014 |
| KR | 10-2016-0135287 A | 11/2016 |

* cited by examiner

*Primary Examiner* — Evren Seven
(74) *Attorney, Agent, or Firm* — Innovation Counsel LLP (57) ABSTRACT

A display apparatus including a display substrate, a light-emitting device on the display substrate, an encapsulation substrate on the light-emitting device and bonded to the display substrate, and a diffraction-grating layer on a top surface of the encapsulation substrate, wherein the diffraction-grating layer includes a plurality of diffraction patterns spaced apart from one another by a predetermined distance, and each of the plurality of diffraction patterns has a stacked structure of a lower layer and an upper layer, wherein the lower and upper layers include different materials.

9 Claims, 7 Drawing Sheets

DISPLAY APPARATUS AND METHOD OF MANUFACTURING THE SAME

CROSS-REFERENCE TO RELATED APPLICATION

This application claims the benefit of Korean Patent Application No. 10-2018-0098765, filed on Aug. 23, 2018, in the Korean Intellectual Property Office, the disclosure of which is incorporated herein in its entirety by reference.

BACKGROUND

1. Field

One or more embodiments relate to a display apparatus that can be used in a head-mounted display apparatus and a method of manufacturing the same.

2. Description of the Related Art

As the field of displays that represent a variety of electrical signal information visually has rapidly developed, a variety of display apparatuses having excellent characteristics, such as slimness, low weight, and low power consumption, have been studied and developed. In addition, interest in wearable devices has increased, and thus, head-mounted display apparatuses have been introduced. The head-mounted display apparatuses display an image in front of a user's eyes such that the user can experience virtual reality or augmented reality. Such a head-mounted display apparatus may include lens for enlarging an image provided by the display apparatus, between the display apparatus and the user's eyes, so as to display the image in front of the user's eyes. However, when the image is enlarged by the lens, a screen door effect (SDE) may occur in which a non-emission region of the display apparatus is recognized by the user.

SUMMARY

One or more embodiments include a display apparatus that may provide an image with high quality by improving a screen door effect (SDE), and a method of manufacturing the same.

Additional aspects will be set forth in part in the description which follows and, in part, will be apparent from the description, or may be learned by practice of the presented embodiments.

According to one or more embodiments, a display apparatus includes: a display substrate; a light-emitting device on the display substrate; an encapsulation substrate on the light-emitting device and bonded to the display substrate; and a diffraction-grating layer on a top surface of the encapsulation substrate, wherein the diffraction-grating layer includes a plurality of diffraction patterns spaced apart from one another by a predetermined distance, each of the plurality of diffraction patterns has a stacked structure of a lower layer and an upper layer, and the lower layer and an upper layer include different materials.

The upper layer may include a same material as the encapsulation substrate.

The plurality of diffraction patterns may be arranged with a same period in a first direction and a second direction which intersect each other perpendicularly.

The lower layer and the upper layer may include different inorganic materials. The lower layer may include at least one selected from the group consisting of indium tin oxide (ITO), indium zinc oxide (IZO), and indium tin zinc oxide (ITZO).

The upper layer may include at least one selected from the group consisting of silicon oxide, silicon nitride, and silicon oxynitride.

The lower layer may include undercut regions recessed from side edges of the upper layer.

A thickness of the lower layer may be thinner than that of the upper layer.

The display substrate may include a thin-film transistor electrically connected to the light-emitting device.

The light-emitting device may include a pixel electrode electrically connected to the thin-film transistor, an opposite electrode on the pixel electrode, and an intermediate layer interposed between the pixel electrode and the opposite electrode and including an emission layer.

According to one or more embodiments, a method of manufacturing a display apparatus includes: forming a light-emitting device on a display substrate; placing an encapsulation substrate on the light-emitting device and bonding the display substrate to the encapsulation substrate; and forming a diffraction-grating layer on a top surface of the encapsulation substrate, wherein the forming of the diffraction-grating layer includes: sequentially forming a first layer and a second layer, which include different materials, on the whole of the top surface of the encapsulation substrate; patterning the second layer by using a photosensitive layer as a mask, to form an upper layer of the diffraction-grating layer; and patterning the first layer by using the patterned second layer as a mask, to form a lower layer of the diffraction-grating layer.

The upper layer and the lower layer may constitute diffraction patterns of the diffraction-grating layer, and the diffraction patterns may be spaced apart from one another by a predetermined distance.

The first layer and the second layer may include different inorganic materials.

The second layer may include a same material as the encapsulation substrate.

The first layer may include at least one selected from the group consisting of indium tin oxide (ITO), indium zinc oxide (IZO), and indium tin zinc oxide (ITZO).

The second layer may include at least one selected from the group consisting of silicon oxide, silicon nitride, and silicon oxynitride.

The display substrate may include a thin-film transistor electrically connected to the light-emitting device, and the light-emitting device may include a pixel electrode electrically connected to the thin-film transistor, an opposite electrode on the pixel electrode, and an intermediate layer interposed between the pixel electrode and the opposite electrode and including an emission layer.

A thickness of the lower layer may be thinner than that of the upper layer.

The second layer may be patterned by dry etching and the first layer may be patterned by wet etching.

The first layer may include undercut regions recessed from side edges of the second layer.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the present disclosure allows for various changes and numerous embodiments, particular embodiments will be illustrated in the drawings and described in detail in the written description. The effects and features of the present disclosure, and ways to achieve them will become apparent by referring to embodiments that will be described later in detail with reference to the drawings. However, the present disclosure is not limited to the following embodiments but may be embodied in various forms.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Hereinafter, embodiments of the present disclosure will be described below in more detail with reference to the accompanying drawings. Those components that are the same or are in correspondence are rendered the same reference numeral regardless of the figure number.

Figure 1:
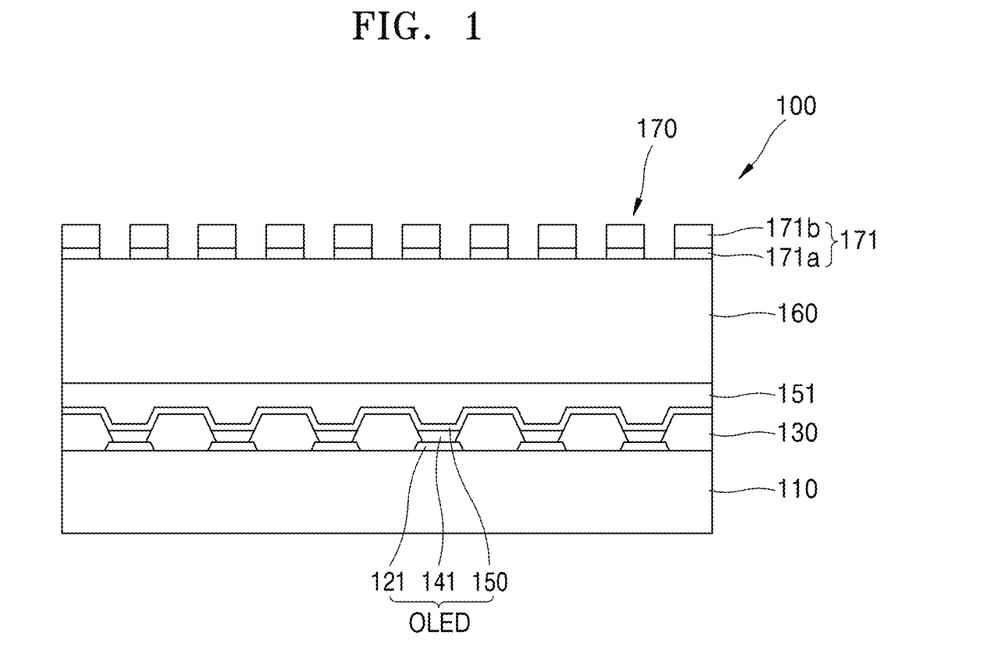
FIG. 1 is a cross-sectional view schematically illustrating an example of a display apparatus according to an exemplary embodiment.
Figure 2:
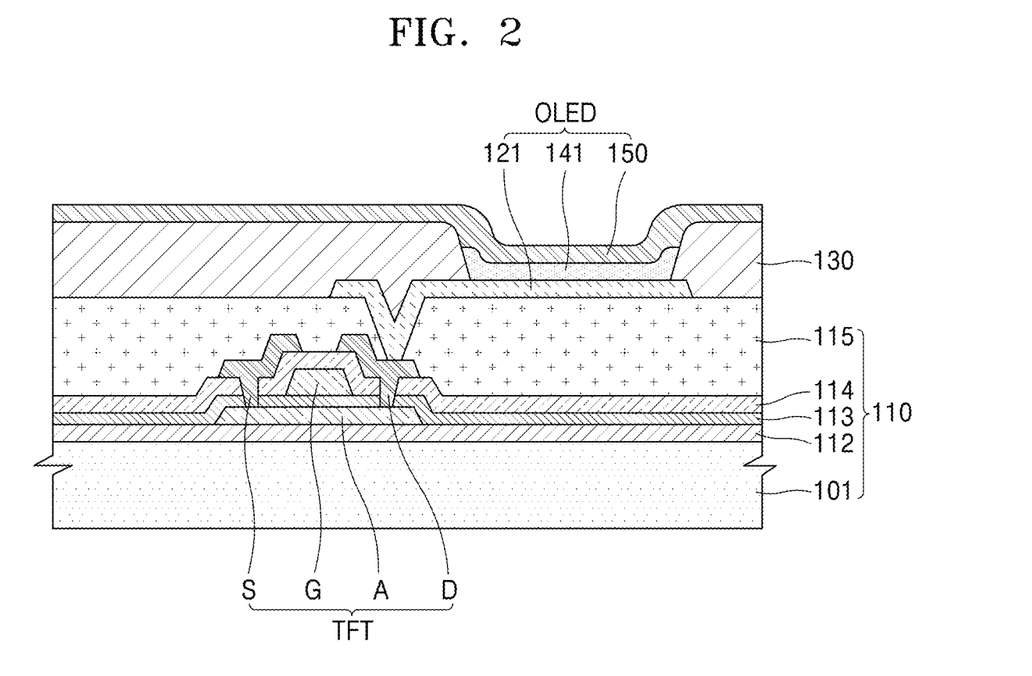
FIG. 2 is a cross-sectional view schematically illustrating an example of a display substrate and a light-emitting device of the display apparatus of FIG. 1.

FIG. 1 is a cross-sectional view for schematically illustrating an example of a display apparatus according to an exemplary embodiment, and FIG. 2 is a cross-sectional view for schematically illustrating an example of a display substrate and a light-emitting device of the display apparatus of FIG. 1.

Referring to FIGS. 1 and 2, a display apparatus 100 according to an exemplary embodiment may include a display substrate 110, a light-emitting device disposed on the display substrate 110, an encapsulation substrate 160 disposed above the display substrate 110, and a diffraction-grating layer 170 disposed on a top surface of the encapsulation substrate 160. Hereinafter, the light-emitting device will be explained as an organic light-emitting device (OLED) having a pixel electrode 121, an opposite electrode 150, and an intermediate layer 141 interposed between the pixel electrode 121 and the opposite electrode 150 and including an emission layer. However, embodiments of the present disclosure are not limited thereto, and the display apparatus 100 may include a variety of types of light-emitting devices.

The display substrate 110 may include a base substrate 101 and a thin film transistor (TFT) disposed on the base substrate 101 and electrically connected to the OLED. Besides, the display substrate 110 may include a capacitor and electronic devices required for driving the OLED.

The base substrate 101 may be an insulating substrate. For example, the base substrate 101 may be formed of a transparent glass material having a main component of silicon oxide ($SiO_2$). However, the base substrate 101 is not limited thereto and may also be formed of a transparent plastic material. The plastic material may include polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), cellulose acetate propionate (CAP), and the like.

Also, when the display apparatus 100 is of a top (front) emission type, the base substrate 101 need not to be formed of a transparent material. In this case, the base substrate 101 may be formed of metal. When the base substrate 101 is formed of metal, the base substrate 101 may include iron (Fe), chrome (Cr), manganese (Mn), nickel (Ni), titanium (Ti), molybdenum (Mo), stainless steel (SUS), an Invar alloy, an Inconel alloy, a Kovar alloy, and the like.

A buffer layer 112 may be formed on the base substrate 101. The buffer layer 112 may provide a flat surface to a top portion of the base substrate 101 and may block foreign substances penetrating through the base substrate 101, or foreign substances eluted from the base substrate 101 during a process of manufacturing the display apparatus 100. For example, the buffer layer 112 may include an inorganic material, such as silicon oxide, silicon nitride, silicon oxynitride, aluminum oxide, aluminum nitride, titanium oxide, or titanium nitride, or an organic material, such as polyimide, polyester, or acryl, and may be formed of a plurality of stack structures among the above-described materials.

The TFT is placed on the buffer layer 112. The TFT includes a semiconductor layer A including amorphous silicon, polycrystalline silicon, or an organic semiconductor material, a gate electrode G, a source electrode S, and a drain electrode D.

The gate electrode G is disposed on a top portion of the semiconductor layer A. The source electrode S and the drain electrode D are electrically connected to each other according to a signal applied to the gate electrode G. The gate electrode G may include at least one selected from the group consisting of, for example, aluminum (Al), platinum (Pt), palladium (Pd), silver (Ag), magnesium (Mg), gold (Au), Ni, neodymium (Nd), iridium (Ir), Cr, lithium (Li), calcium (Ca), Mo, Ti, tungsten (W), copper (Cu) and may have a single layer or multi-layer structure. In this case, in order to attain insulating performance of the semiconductor layer A and the gate electrode G, a gate insulating layer 113 may be formed of an inorganic material, such as silicon oxide, silicon nitride, or silicon oxynitride, and may be interposed between the semiconductor layer A and the gate electrode G.

An interlayer insulating layer 114 may be disposed on a top portion of the gate electrode G. The interlayer insulating layer 114 may have a single layer or multi-layer structure formed of an inorganic material, such as silicon oxide, silicon nitride, or silicon oxynitride.

The source electrode S and the drain electrode D are disposed on a top portion of the interlayer insulating layer 114. Each of the source electrode S and the drain electrode D is electrically connected to the semiconductor layer A via a contact hole formed in the interlayer insulating layer 114 and the gate insulating layer 113, respectively. The source electrode S and the drain electrode D may include at least one selected from the group consisting of, for example, Al, Pt, Pd, Ag, Mg, Au, Ni, Nd, Ir, Cr, Li, Ca, Mo, Ti, W, and Cu in consideration of conductivity and may have a single layer or multi-layer structure.

In order to protect the TFT having this structure, a protective layer (not shown) covering the TFT may be disposed. The protective layer may be formed of an inorganic material, such as silicon oxide, silicon nitride, or silicon oxynitride. The protective layer may be a single layer or multi-layer.

A planarization layer 115 may be disposed on the TFT. For example, when the OLED is disposed at a higher position than the TFT, as shown in FIG. 2, the planarization layer 115 may planarize a curve caused by the TFT by covering the TFT. The planarization layer 115 may include an organic material, such as acryl, benzocyclobutene (BCB), or hexamethyldisiloxane (HMDSO). In FIG. 2, the planarization layer 115 is a single layer. However, various modifications, such as the planarization layer 115 that is a single layer, are possible. Of course, the display apparatus 100 according to the current embodiment may have both the protective layer and the planarization layer 115 or may have only the planarization layer 115 as needed.

The OLED including a pixel electrode 121, an opposite electrode 150 and an intermediate layer 141 interposed therebetween and having an emission layer is disposed on the display substrate 110. In detail, an opening for exposing at least one of the source electrode S and the drain electrode D of the TFT is present in the planarization layer 115, and the pixel electrode 121 that is in contact with one of the source electrode S and the drain electrode D and electrically connected to the TFT, is disposed on the planarization layer 115.

The pixel electrode 121 may be a (semi-)transparent electrode or a reflective electrode. When the pixel electrode 121 is a (semi-)transparent electrode, the pixel electrode 121 may include indium tin oxide (ITO), indium zinc oxide (IZO), zinc oxide (ZnO), $In_2O_3$, indium gallium oxide (IGO), or aluminum-doped zinc oxide (AZO). When the pixel electrode 121 is a reflective electrode, the pixel electrode 121 may have a reflective layer formed of Ag, Mg, Al, Pt, Pd, Au, Ni, Nd, Ir, Cr, and a compound thereof, and a layer formed of ITO, IZO, ZnO, $In_2O_3$, IGO, or AZO. Of course, embodiments of the present disclosure are not limited thereto, and the pixel electrode 121 may include various materials and various modifications of the structure of the pixel electrode 121 including a single layer or multi-layer structure are possible.

A pixel defining layer 130 may be disposed at a top portion of the planarization layer 115. The pixel defining layer 130 has an opening for exposing at least a central part of the pixel electrode 121, thereby defining a pixel. Also, as shown in FIG. 2, the pixel defining layer 130 covers edges of the pixel electrode 121, thereby increasing a distance between the edges of the pixel electrode 121 and the opposite electrode 150 of the top portion of the pixel electrode 121 so as to prevent arc from occurring in the edges of the pixel electrode 121. The pixel defining layer 130 may include an organic material, such as polyimide or HMDSO.

The intermediate layer 141 of the OLED includes an emission layer. The emission layer may include a polymer or small molecular weight organic material emitting light with a predetermined color. Also, the intermediate layer 141 may include at least one functional layer selected from the group consisting of a hole transport layer (HTL), a hole injection layer (HIL), an electron transport layer (ETL), and an electron injection layer (EIL). The functional layer may include an organic material.

The opposite electrode 150 may be formed as a single body in a plurality of OLEDs to correspond to a plurality of pixel electrodes 121. The opposite electrode 150 may be a (semi-)transparent electrode or reflective electrode. When the opposite electrode 150 is a (semi-)transparent electrode, the opposite electrode 150 may have a layer formed of metal having a small work function, such as, Li, Ca, LiF/Ca, LiF/Al, Al, Ag, Mg, and a compound thereof, and a (semi-) transparent conductive layer formed of ITO, IZO, ZnO, or $In_2O_3$. When the opposite electrode 150 is a reflective electrode, the opposite electrode 150 may have a layer formed of Li, Ca, LiF/Ca, LiF/Al, Al, Ag, Mg, and a compound thereof. Of course, a composition and a material of the opposite electrode 150 are not limited thereto, and various modifications are possible.

The encapsulation substrate 160 may be disposed above the display substrate 110. In an embodiment, the encapsulation substrate 160 that is a transparent insulating layer, may be a glass substrate, a quartz substrate, a transparent resin substrate, or the like. A sealing member may be disposed at edges of the encapsulation substrate 160 and the display substrate 110 between the encapsulation substrate 160 and the display substrate 110 so as to bond the encapsulation substrate 160 to the display substrate 110. Thus, an internal space of the display apparatus 100 in which the OLED is disposed, may be sealed so that penetration of external oxygen and moisture may be prevented.

A filling material 151 may be disposed in a space between the opposite electrode 150 and the encapsulation substrate 160. The filling material 151 may prevent damage of the display apparatus 100 due to shock and may attain mechanical stability of the display apparatus 100. The filling material 151 may be formed of a material having an elastic force and an adhesive property. For example, the filling material 151 may be a silicon-based resin including a siloxane cross-linking reaction, for example, a silicon-based resin including polymethyltrifluoropropyl siloxane, polymethylvinyl-siloxane, and the like. In another example, no particular element may be disposed in the space between the opposite electrode 150 and the encapsulation substrate 160. In this case, an air layer is disposed in the space between the opposite electrode 150 and the encapsulation substrate 160.

The diffraction-grating layer 170 may be disposed on a top surface of the encapsulation substrate 160. The diffraction-grating layer 170 may include a plurality of diffraction patterns 171, which are spaced apart from one another by a predetermined distance, may be disposed on a proceeding path of light emitted from the OLED, may diffract the emitted light, and may enlarge an emission area of the OLED. Also, each of the plurality of diffraction patterns 171 has a stack structure with a lower layer 171a and an upper layer 171b formed of different materials so that unevenness may be prevented from occurring in the surface of the encapsulation substrate 160 when the diffraction patterns 171 are formed. Thus, when the light emitted from the OLED is diffracted by the diffraction-grating layer 170, an optical path may be prevented from being changed by unevenness, or the like.

Figure 3:
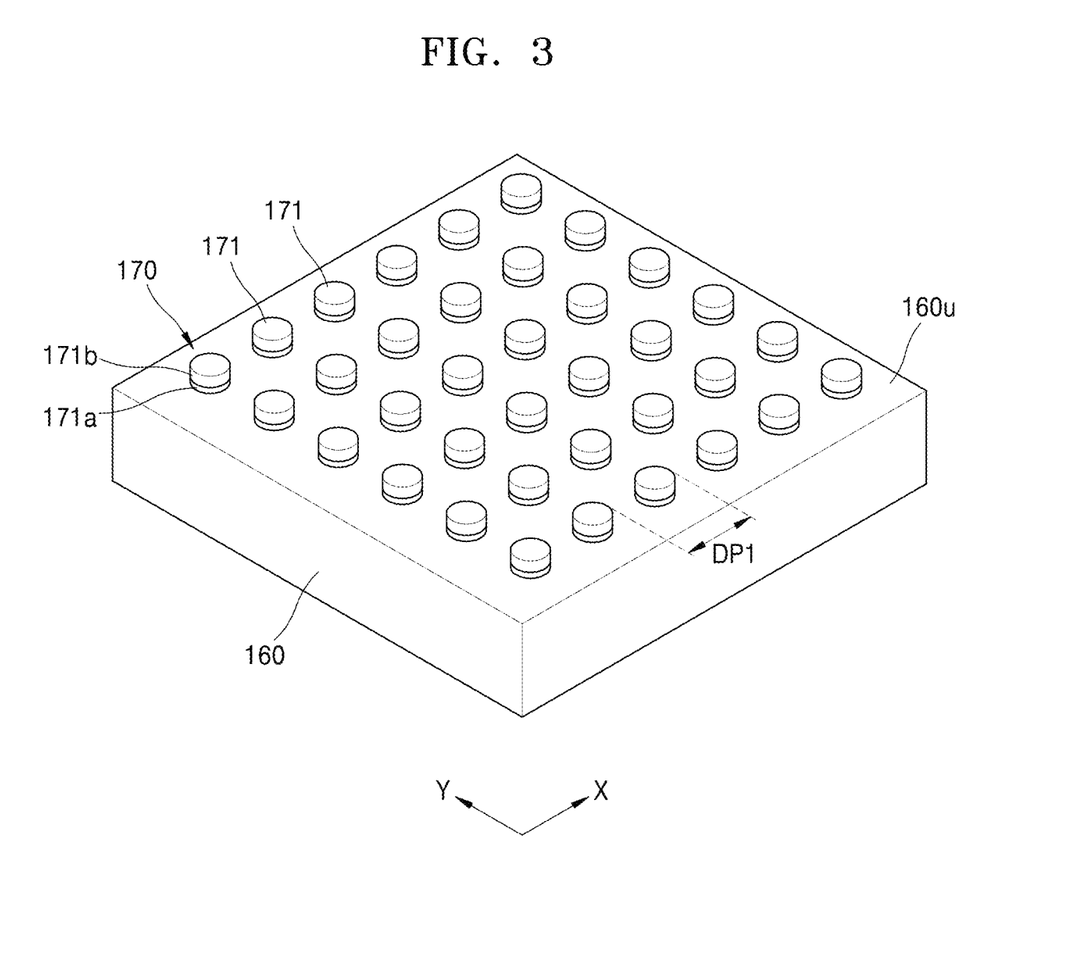
FIG. 3 is a perspective view schematically illustrating an example of a diffraction-grating layer of the display apparatus of FIG. 1.
Figure 4:
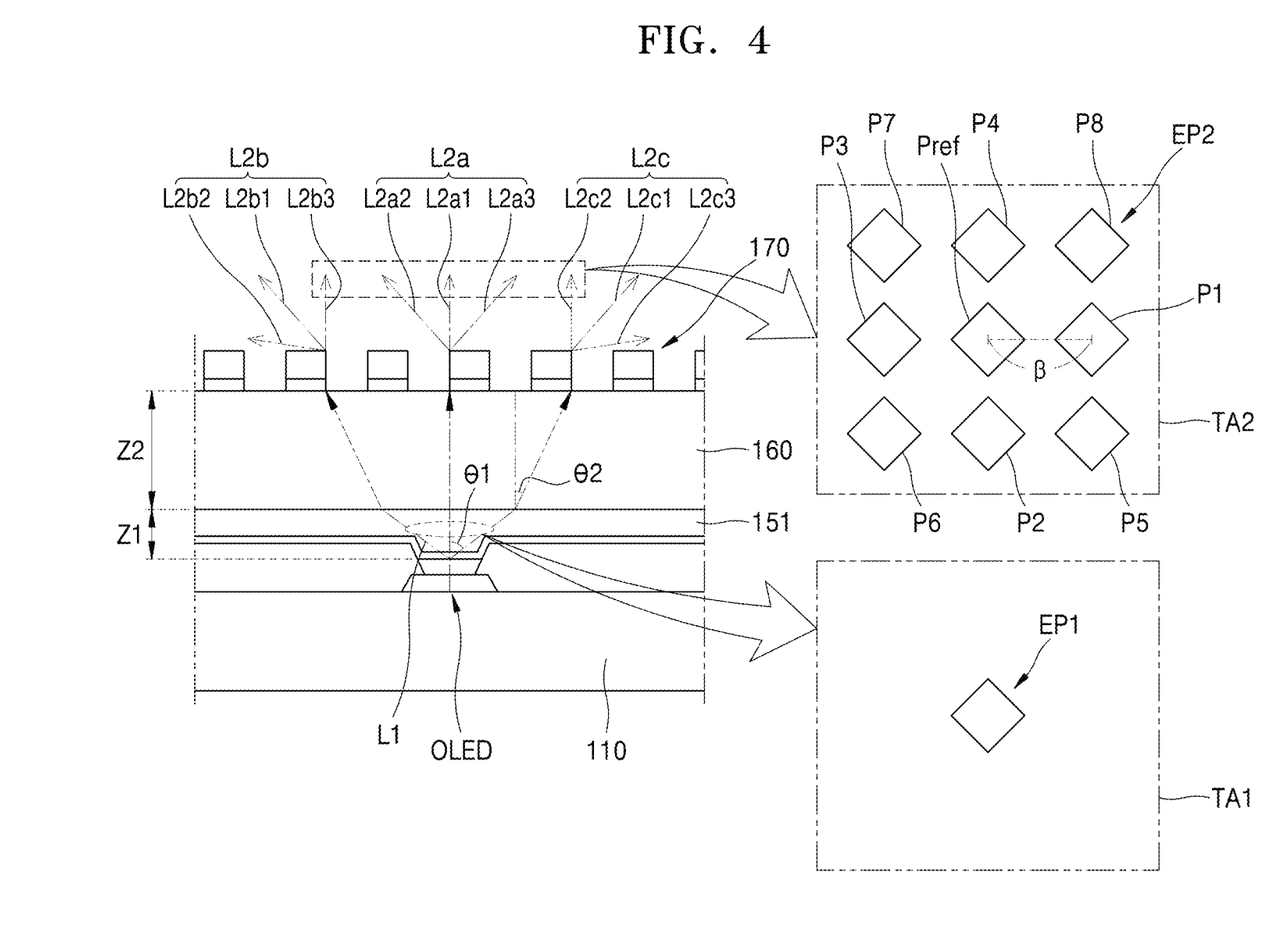
FIG. 4 is a view for explaining enlargement of an emission region formed by the diffraction-grating layer of the display apparatus of FIG. 1.

FIG. 3 is a perspective view for schematically illustrating an example of a diffraction-grating layer of the display apparatus of FIG. 1, and FIG. 4 is a view for explaining enlargement of an emission region formed by the diffraction-grating layer of the display apparatus of FIG. 1.

First, referring to FIG. 3, the diffraction-grating layer 170 disposed on a top surface 160u of the encapsulation substrate 160 includes a plurality of diffraction patterns 171. Each of the plurality of diffraction patterns 171 may protrude from the top surface 160u of the encapsulation substrate 160 and may have the same shape. In an example, each of the plurality of diffraction patterns 171 may have a cylindrical shape. However, embodiments of the present disclosure are not limited thereto, and each of the plurality of diffraction patterns 171 may have various shapes including a square pillar shape.

The plurality of diffraction patterns 171 may be spaced apart from one another by a predetermined distance. That is, the plurality of diffraction patterns 171 may be disposed on the top surface 160u of the encapsulation substrate 160 while having the same period DP1 in a first direction X and a second direction Y. The first direction X and the second direction Y may be perpendicular to each other. Also, the period DP1 is a distance from one side of each of the diffraction patterns 171 to one side of each adjacent one of the diffraction patterns 171 at the same position. Alternatively, the period DP1 may also be understood as a distance between the center of each of the diffraction patterns 171 and the center of each adjacent one of the diffraction patterns 171.

The plurality of diffraction patterns 171 may increase the emission area of the light emitted from the OLED, as shown in FIG. 4.

Hereinafter, an emission pattern generated in a first region TA1 due to light L1 emitted from the OLED is defined as a first emission pattern EP1, and an emission pattern generated in a second region TA2 due to lights L2a, L2b, and L2c that pass through the diffraction-grating layer 170 is defined as a second emission pattern EP2. The first region TA1 may be an arbitrary region in a lower portion of the encapsulation substrate 160, and the second region TA2 may be a region in an upper portion of the diffraction-grating layer 170. Also, the light L1 emitted from the OLED is referred to as an 'exit light', and the lights L2a, L2b, and L2c that pass through the diffraction-grating layer 170 are referred to as 'diffraction lights'.

The exit light L1 may pass through the filling material 151 and the encapsulation substrate 160 and may be provided to the diffraction-grating layer 170. In this case, due to a refraction index of the filling material 151 and the encapsulation substrate 160, the exit light L1 may be incident on the filling material 151 with a first incidence angle $\theta 1$ and incident on the encapsulation substrate 160 with a second incidence angle $\theta 2$.

The diffraction-grating layer 170 may diffract the exit light L1 that passes through the encapsulation substrate 160 to generate diffraction lights L2a, L2b, and L2c. Hereinafter, for convenience of explanation, first through third diffraction lights L2a, L2b, and L2c will be described.

The first through third diffraction lights L2a, L2b, and L2c may include zero-order and first-order diffraction lights. Here, the zero-order diffraction light is a light having the same optical path before and after the light is diffracted by the diffraction-grating layer 170. Also, the first-order diffraction light is a light having an optical path being changed due to the diffraction-grating layer 170 and having a second diffraction angle $\theta 2$ based on the zero-order diffraction light.

That is, reference numerals L2b1, L2a1, and L2c1 are zero-order diffraction lights. Also, reference numerals L2b2, L2b3, L2a2, L2a3, L2c2, and L2c3 are first-order diffraction lights. In another embodiment, the first through third diffraction lights L2a, L2b, and L2c may further include second-order or more diffraction lights. In the present specification, an example in which the first through third diffraction lights L2a, L2b, and L2c include a zero-order diffraction light and a first-order diffraction light, will be described.

The first through third diffraction lights L2a, L2b, and L2c may include first through third effective lights L2a1, L2b3, and L2c2 having vertical optical paths with respect to the display substrate 110. Here, a vertical direction may be a fully vertical based on the display substrate 110 and a direction substantially close to the vertical direction. When the effective lights have vertical optical paths with respect to the display substrate 110, order numbers of diffraction lights are not limited. That is, when the effective lights have vertical optical paths, the effective lights may include both a zero-order diffraction light and a first-order diffraction light.

The diffraction-grating layer 170 diffracts the light L1 emitted from the OLED, thereby generating the first through third effective lights L2a1, L2b3, and L2c2. Thus, the second emission pattern EP2 may include a reference emission pattern Pref and a plurality of replicated emission patterns P1 through P8 replicated from the reference emission pattern Pref.

The first region TA1 and the second region TA2 have the same areas. Contrary to this, the number of emission patterns included in the second region TA2 is greater than the number of emission patterns included in the first region TA1. This means that the area of the emission region of the second region TA2 is greater than the area of the first region TA1.

The large area of the emission region may be represented as a large effective emission area ratio. The effective emission area ratio is defined as the ratio of the area of the emission pattern in one region with respect to the area of one region. Here, the emission pattern for calculating the effective emission area ratio may include both a reference emission pattern and a replicated emission pattern. For example, nine emission patterns including the reference emission pattern Pref and the plurality of replicated emission patterns P1 through P8 are present in the second region TA2, whereas one emission pattern is present in the first region TA1. Thus, the effective emission area ratio of the second region TA2 is greater than the effective emission area ratio of the first region TA1.

The effective emission area ratio may be increased when a diffraction distance β is increased. The diffraction distance β may be effected by a wavelength of light emitted from the OLED, the thickness and the refractive index of the filling material 151, the thickness and the refractive index of the encapsulation substrate 160, and the period DP1 of each of the diffraction patterns 171.

That is, the diffraction distance β may be expressed as the following equation 1.

$$\beta = z1 \cdot \tan\theta 1 + z2 \cdot \tan\theta 2 \quad (1)$$

where z1 is the shortest distance between the OLED and the encapsulation substrate 160, z2 is the shortest distance between the filling material 151 and the diffraction-grating layer 170. That is, z2 may be defined as the thickness of the encapsulation substrate 160. As described above, θ1 and θ2 are incidence angles on the filling material 151 and the encapsulation substrate 160, respectively, and may be expressed as the following equations 2 and 3, respectively.

$$\theta 1 = \sin^{-1}\left(\frac{\lambda}{DP1} \cdot \frac{1}{n151}\right), \quad (2)$$

where λ is a wavelength of the light emitted from the OLED, and n151 is a refractive index of the filling material 151.

$$\theta 2 = \sin^{-1}\left(\frac{\lambda}{DP1} \cdot \frac{1}{nEN}\right), \quad (3)$$

where nEN is a refractive index of the encapsulation substrate 160.

When θ1 and θ2 are substituted in the above equation 1, the diffraction distance β may be expressed as the following equation 4.

$$\beta = z1 \cdot \tan\left[\sin^{-1}\left(\frac{\lambda}{DP1} \cdot \frac{1}{n151}\right)\right] + z2 \cdot \tan\left[\sin^{-1}\left(\frac{\lambda}{DP1} \cdot \frac{1}{nEN}\right)\right] \quad (4)$$

In one embodiment, when another element instead of the filling material 151 is present between the encapsulation substrate 160 and the OLED, n151 of equation 4 may be substituted with a refractive index of another element. In another embodiment, when an air layer is present between the encapsulation substrate 160 and the OLED, n151 of equation 4 may be substituted with a refractive index of air.

In another embodiment, when the thickness of the filling material 151 is too small to be ignored, the shortest distance between the OLED and the diffraction-grating layer 170 may be approximated to the thickness of the encapsulation substrate 160. In this case, a diffraction distance β' may be simply expressed as the following equation 5.

$$\beta' = z2 \cdot \tan\left[\sin^{-1}\left(\frac{\lambda}{DP1} \cdot \frac{1}{nEN}\right)\right] \quad (5)$$

In other words, the display apparatus (100 of FIG. 1) according to an exemplary embodiment of the present disclosure may adjust an emission color of the OLED, the thickness and the refractive index of the encapsulation substrate 160, and the period DP1 of each of the diffraction patterns 171, thereby controlling the diffraction distance β. Thus, the effective emission area ratio of the display apparatus (100 of FIG. 1) may be increased. Thus, when the display apparatus (100 of FIG. 1) according to the present disclosure is used in a head-mounted display apparatus, even when an image is enlarged by a lens, a screen door effect (SDE) may be prevented from occurring.

Referring back to FIG. 3, each of the plurality of diffraction patterns 171 has a stack structure of a lower layer 171a including a first inorganic material and an upper layer 171b including a second inorganic material. The first inorganic material and the second inorganic material are different from each other.

The first inorganic material may include at least one selected from the group consisting of ITO, IZO, and ITZO having a large etching selectivity with respect to the encapsulation substrate 160 and excellent transmittance. The second inorganic material may be a silicon-containing inorganic material having a large etching selectivity with respect to the first inorganic material. For example, the second inorganic material may include at least one selected from the group consisting of silicon oxide, silicon nitride, and silicon oxynitride. For example, a dry etch ratio of the second inorganic material, for example, silicon nitride, may be less than 150 nm/min and a dry etch ratio of the first inorganic material, for example, ITO, may be less than 50 nm/min. A wet etch ratio of the second inorganic material, for example, silicon nitride, may be less than 10 nm/min and a wet etch ratio of the first inorganic material, for example, ITO, may be less than 100 nm/min. The thickness of the first inorganic material may be from about 10 Å to about 10,000 Å and the thickness of the second inorganic material may be from about 10 Å to about 10,000 Å.

In this way, when each of the plurality of diffraction patterns 171 has a stack structure of the lower layer 171a and the upper layer 171b formed of different materials, when each of the diffraction patterns 171 is formed, unevenness may be prevented from occurring in the surface of the encapsulation substrate 160. Thus, when the light emitted from the OLED is diffracted by the diffraction-grating layer 170, an optical path may be prevented from being changed by unevenness so that the shape of a replicated emission pattern may be prevented from being degraded.

Figure 5:
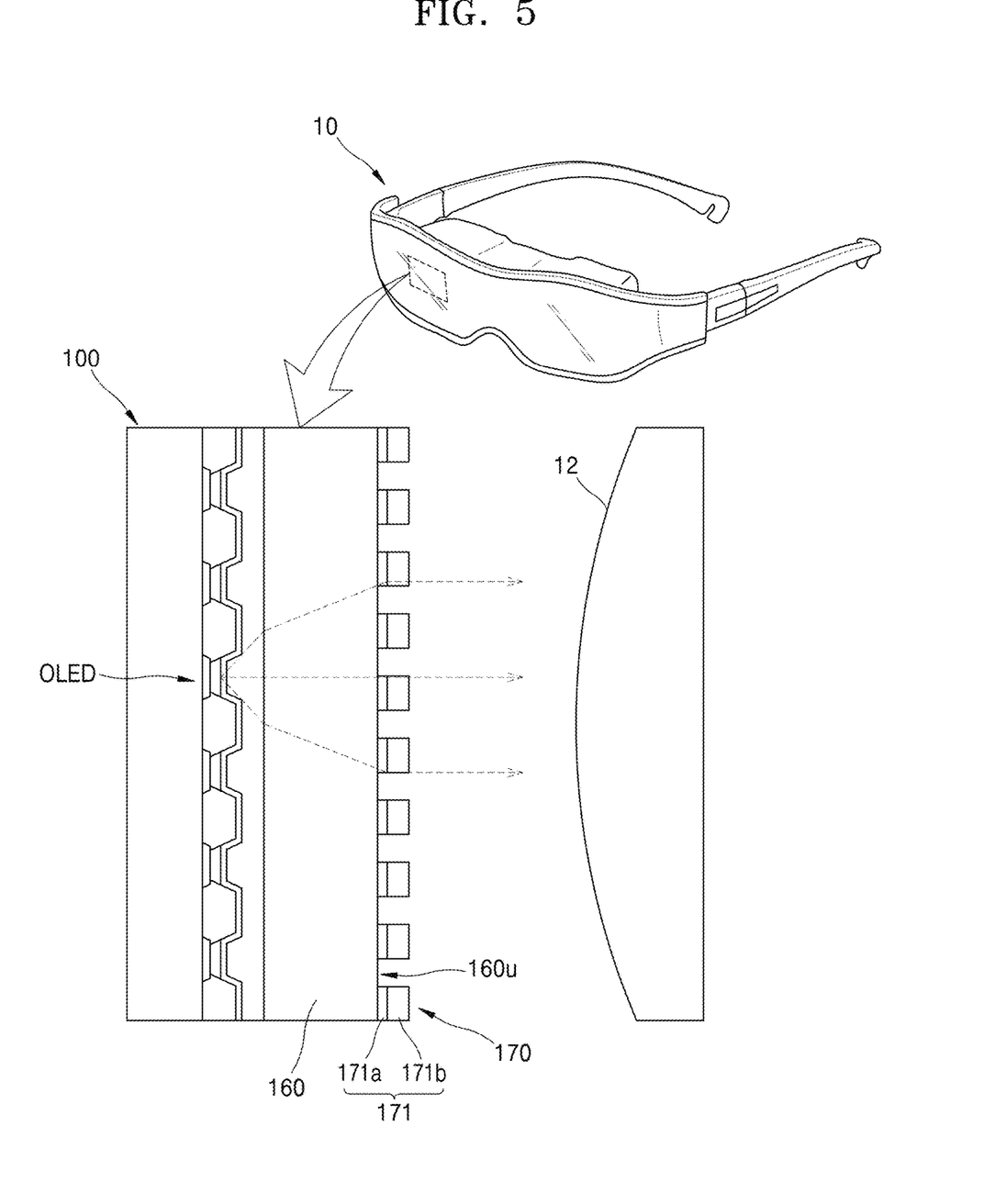
FIG. 5 is a cross-sectional view schematically illustrating an example of a head-mounted display apparatus including the display apparatus of FIG. 1.

FIG. 5 is a cross-sectional view for schematically illustrating an example of a head-mounted display apparatus including the display apparatus of FIG. 1.

Referring to FIG. 5, a head-mounted display apparatus 10 may include a lens unit 12 and a display apparatus 100 that provides an image to the lens unit 12. Also, the head-mounted display apparatus 10 may further include a camera, an infrared sensor, a signal processor, and a frame that may be mounted on the user's head.

The lens unit 12 may be disposed between the display apparatus 100 and the user and may enlarge the image provided from the display apparatus 100. The lens unit 12 may include an opaque lens so as to realize virtual reality or a transparent or semi-transparent lens so as to realize augmented reality.

The display apparatus 100 includes a diffraction-grating layer 170 disposed on the encapsulation substrate 160, as described above. The diffraction-grating layer 170 includes diffraction patterns 171 spaced apart from one another by a predetermined distance so that the effective emission area of the light emitted from the OLED may be increased. Also, each of the diffraction patterns 171 has a stack structure of the lower layer 171a and the upper layer 171b formed of different inorganic materials so as to prevent the top surface 160u of the encapsulation substrate 160 from being damaged. Thus, the shape of the replicated emission pattern formed when the light emitted from the OLED passes through the diffraction-grating layer 170 may be uniform.

Thus, even when the image displayed by the display apparatus 100 is enlarged by the lens unit 12, the user does not easily recognize the non-emission region of the display apparatus 100. Thus, when the head-mounted display apparatus 10 is driven, the SDE may be improved, and an image with high quality may be provided.

FIGS. 6 through 9 are cross-sectional views for schematically illustrating a method of manufacturing the display apparatus of FIG. 1.

Figure 6:
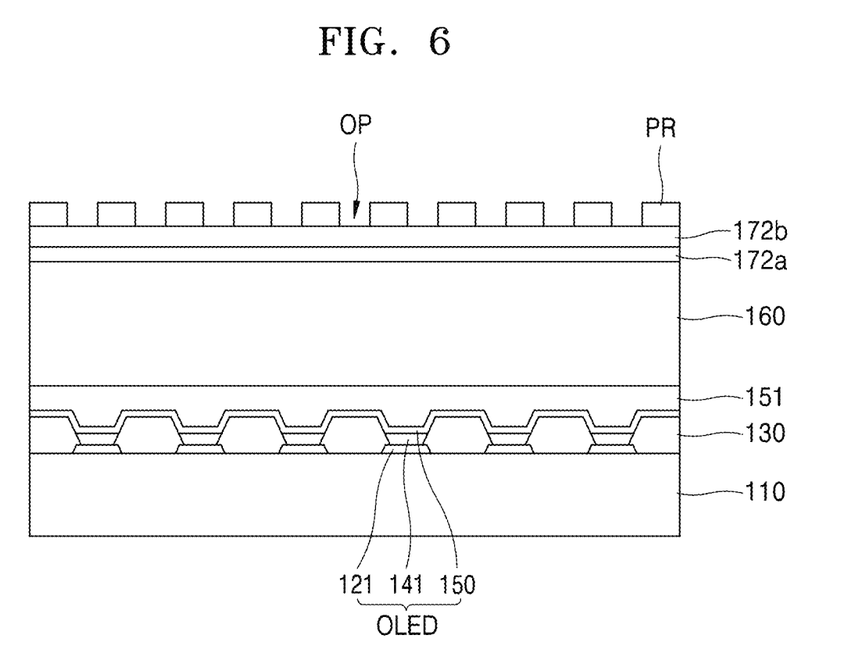
FIGS. 6 through 9 are cross-sectional views schematically illustrating a method of manufacturing the display apparatus of FIG. 1.

First, as shown in FIG. 6, after the OLED is formed on the display substrate 110, the display substrate 110 and the encapsulation substrate 160 are bonded to each other. In this case, the TFT electrically connected to the OLED may be formed in the display substrate 110, as described above.

Bonding of the display substrate 110 and the encapsulation substrate 160 may be performed by applying a sealing member onto edges of the display substrate 110 or the encapsulation substrate 160 and then by placing the encapsulation substrate 160 on the OLED so that the OLED is placed between the display substrate 110 and the encapsulation substrate 160 and by curing the sealing member. Also, when the display substrate 110 and the encapsulation substrate 160 are bonded to each other, a space between the opposite electrode 150 and the encapsulation substrate 160 may be filled by the filling material 151.

The pixel defining layer 130 is formed to expose the central part of the pixel electrode 121 of the OLED, and the intermediate layer 141 including an organic emission layer is formed on the exposed pixel electrode 121. Also, the opposite electrode 150 may be formed as a single body in a plurality of OLEDs to correspond to the plurality of pixel electrodes 121.

After the display substrate 110 and the encapsulation substrate 160 are bonded to each other, the diffraction-grating layer 170 is formed on a top surface of the encapsulation substrate 160.

In detail, a first layer 172a and a second layer 172b are sequentially formed on the whole of the top surface of the encapsulation substrate 160. The first layer 172a may be formed of a first inorganic material, and the second layer 172b may be formed of a second inorganic material different from the first inorganic material. In an example, the first inorganic material may include at least one selected from the group consisting of ITO, IZO, and ITZO, and the second inorganic material may include at least one selected from the group consisting of silicon oxide, silicon nitride, and silicon oxynitride. A thickness of the first inorganic material 172a may be thinner than that of the second inorganic material 172b to minimize damage to the encapsulation substrate 160. For example, the thickness of the first inorganic material 172a may be from about 10 Å to about 10,000 Å and the thickness of the second inorganic material 172b may be from about 10 Å to about 10,000 Å.

A photosensitive layer PR is formed on the second layer 172b and is patterned to form an opening OP.

Figure 7:
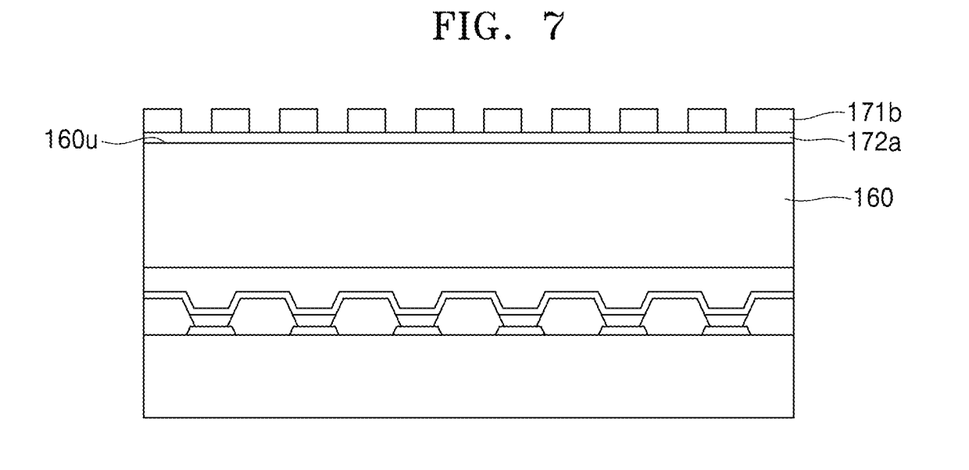
Figure 8:
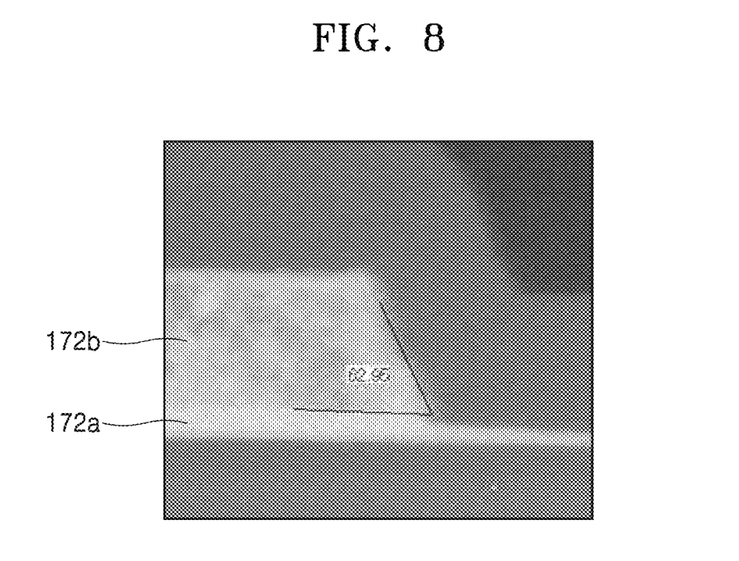

Subsequently, as shown in FIG. 7, the photosensitive layer PR including the opening OP is used as a mask, and the second layer 172b is patterned so that the upper layer 171b of each of the diffraction patterns (171 of FIG. 9) may be formed. In an example, the second layer 172b may be etched by a dry etching process. Because the first inorganic material and the second inorganic material have large etching selectivity, the first layer 172a is not etched when the second layer 172b is etched. This becomes apparent from FIG. 8 that shows the result in which the first layer 172a is formed of ITO and the second layer 172b is formed of silicon oxide and then is etched. That is, the first layer 172a may function as an etching stopper when the second layer 172b is etched. Thus, while the upper layer 171b is formed, the top surface 160u of the encapsulation substrate 160 is not damaged.

Figure 9:
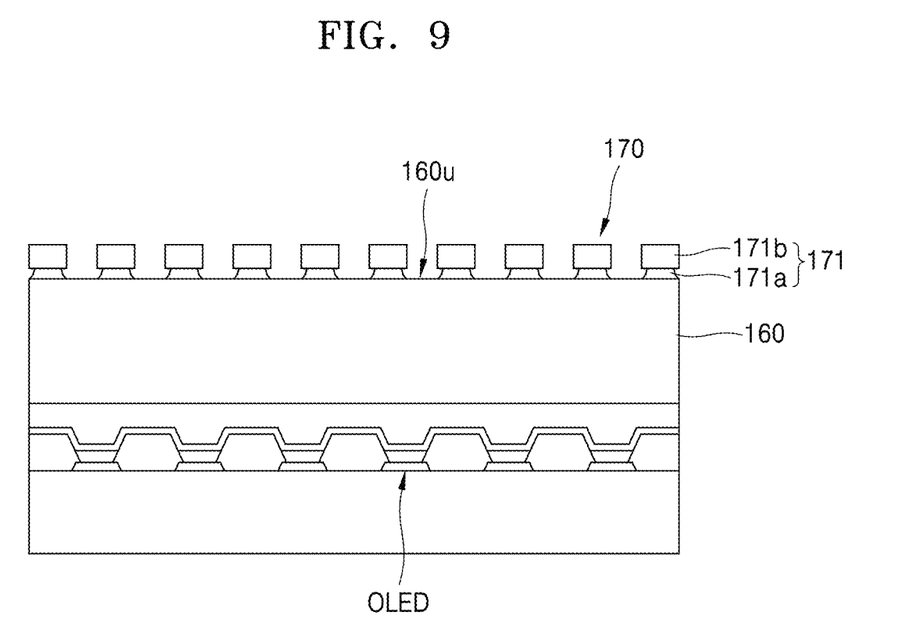

Next, as shown in FIG. 9, the first layer 172a is etched by using the upper layer 171b as a mask so that the lower layer 171a of each of the diffraction patterns 171 may be formed. In an example, the first layer 172a may be etched by a wet etching process. The lower layer may have undercut regions which is recessed from side edges of the upper layer 171b because the wet etching process is an isotropic etching process. Because the encapsulation substrate 160 formed of a glass material has the same component as that of the upper layer 171b formed of silicon oxide, when the first layer 172a for forming the lower layer 171a is etched, the top surface 160u of the encapsulation substrate 160 may not be damaged during an etching process. Thus, the top surface 160u of the encapsulation substrate 160 may not be damaged due to formation of each of the diffraction patterns 171. That is, because no unevenness is formed on the top surface 160u of the encapsulation substrate 160 due to the etching process, the optical path of the light emitted from the OLED may be prevented from being changed by unevenness when the light emitted from the OLED is diffracted by the diffraction-grating layer 170 so that a replicated emission pattern having an uniform shape may be formed when the light emitted from the OLED passes through the diffraction-grating layer 170.

As described above, in a display apparatus according to one or more embodiments, as an emission region is increased by inducing diffraction of light generated from a light-emitting device due to a diffraction-grating layer, when a head-mounted display apparatus is driven, a screen door effect (SDE) may be improved, and an image with high quality may be provided.

Furthermore, the diffraction-grating layer has a stack structure having a lower layer and an upper layer with high etching selectivity so that no damage occurs in the surface of an encapsulation substrate when the diffraction-grating layer is formed, and an optical path of diffraction light may be prevented from being changed.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a display substrate;
   a light-emitting device on the display substrate;
   an encapsulation substrate on the light-emitting device and bonded to the display substrate; and a diffraction-grating layer on a top surface of the encapsulation substrate, wherein the diffraction-grating layer comprises a plurality of diffraction patterns spaced apart from one another by a predetermined distance, wherein each of the plurality of diffraction patterns has a multi-layer structure of a lower layer and an upper layer, and wherein the lower layer and the upper layer include different materials, and further wherein the encapsulation substrate includes a material of the upper layer.

2. The display apparatus of claim 1, wherein the plurality of diffraction patterns are arranged with a same period in a first direction and a second direction which intersect each other perpendicularly.

3. The display apparatus of claim 1, wherein the lower layer and the upper layer comprise different inorganic materials.

4. The display apparatus of claim 3, wherein the lower layer comprises at least one selected from the group consisting of indium tin oxide (ITO), indium zinc oxide (IZO), and indium tin zinc oxide (ITZO).

5. The display apparatus of claim 3, wherein the upper layer comprises at least one selected from the group consisting of silicon oxide, silicon nitride, and silicon oxynitride.

6. The display apparatus of claim 1, wherein the lower layer includes undercut regions recessed from side edges of the upper layer.

7. The display apparatus of claim 1, wherein a thickness of the lower layer is thinner than that of the upper layer.

8. The display apparatus of claim 1, wherein the display substrate comprises a thin-film transistor electrically connected to the light-emitting device.

9. The display apparatus of claim 8, wherein the light-emitting device comprises a pixel electrode electrically connected to the thin-film transistor, an opposite electrode on the pixel electrode, and an intermediate layer interposed between the pixel electrode and the opposite electrode and including an organic emission layer.

* * * * *